United States Patent
Jang

(10) Patent No.: US 9,117,634 B2
(45) Date of Patent: Aug. 25, 2015

(54) ANTENNA UNIT FOR GENERATING PLASMA AND SUBSTRATE PROCESSING APPARATUS INCLUDING THE SAME

(75) Inventor: Yong-Jun Jang, Jeju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 977 days.

(21) Appl. No.: 13/272,235

(22) Filed: Oct. 13, 2011

(65) Prior Publication Data

US 2012/0090785 A1   Apr. 19, 2012

(30) Foreign Application Priority Data

Oct. 19, 2010   (KR) .................. 10-2010-0101683

(51) Int. Cl.
| | |
|---|---|
| C23C 16/00 | (2006.01) |
| C23F 1/00 | (2006.01) |
| H01L 21/306 | (2006.01) |
| H01J 7/24 | (2006.01) |
| H05B 31/26 | (2006.01) |
| H01J 37/32 | (2006.01) |

(52) U.S. Cl.
CPC .................................. *H01J 37/3211* (2013.01)

(58) Field of Classification Search
USPC ........ 156/345.48, 345.49; 118/723 I, 723 IR; 315/111.51
See application file for complete search history.

(56) References Cited

U.S. PATENT DOCUMENTS

| | | | | |
|---|---|---|---|---|
| 6,812,646 | B2* | 11/2004 | Windhorn et al. | 315/111.21 |
| 6,893,533 | B2* | 5/2005 | Holland et al. | 156/345.48 |
| 2003/0057844 | A1 | 3/2003 | Windhorn et al. | |
| 2004/0040939 | A1* | 3/2004 | Oh | 219/121.36 |
| 2004/0056602 | A1* | 3/2004 | Yang et al. | 315/111.21 |
| 2010/0066251 | A1* | 3/2010 | Nakagami et al. | 315/111.51 |
| 2011/0094994 | A1* | 4/2011 | Todorow et al. | 216/68 |
| 2012/0073757 | A1* | 3/2012 | Yamazawa | 156/345.48 |

FOREIGN PATENT DOCUMENTS

| | | |
|---|---|---|
| CN | 1823180 A | 8/2006 |
| CN | 102056393 A | 5/2011 |
| JP | 2004111960 A | 4/2004 |
| JP | 2004537839 A | 12/2004 |
| WO | 0205308 | 1/2002 |
| WO | 2008065744 A1 | 6/2008 |

* cited by examiner

*Primary Examiner* — Rakesh Dhingra

(57) ABSTRACT

An antenna unit for generating a plasma includes: a first antenna including a first incoming portion and a plurality of first sub-antennas divided from the first incoming portion; and a second antenna including a second incoming portion and a plurality of second sub-antennas divided from the second incoming portion, the first and second incoming portions constituting a coaxial line.

11 Claims, 4 Drawing Sheets her own advantages and disadvantages. Accordingly, the
ANTENNA UNIT FOR GENERATING PLASMA AND SUBSTRATE PROCESSING APPARATUS INCLUDING THE SAME This application claims the benefit of Korean Patent Application No. 10-2010-0101683, filed on Oct. 19, 2010, which is hereby incorporated by a reference in its entirety.

TECHNICAL FIELD

The present invention relates to an antenna unit for generating a plasma, and more particularly, to an antenna unit including a coaxial incoming portion and a substrate processing apparatus including the antenna unit.

BACKGROUND

In general, a semiconductor device, a display device and a solar cell are fabricated through a depositing process where a thin film is formed on a substrate, a photolithographic process where a thin film is selectively exposed and shielded by a photosensitive material and an etching process where a thin film is selectively removed. Among the fabricating processes, the depositing process and the etching process are performed in a substrate processing apparatus having a chamber of an optimum vacuum state. In the substrate processing apparatus, a reaction gas is activated to have a plasma state and the fabricating process is performed using the plasma state reaction gas.

The substrate processing apparatus for the depositing process and the etching process may be classified into an inductively coupled plasma (ICP) type and a capacitively coupled plasma (CCP) type according to a method of generating the plasma. The ICP type may be used for a reactive ion etching (RIE) apparatus and a plasma enhanced chemical vapor deposition (PECVD) apparatus, and the CCP type may be used for a high density plasma (HDP) etching apparatus and a HDP deposition apparatus. The ICP type and the CCP type have their respective principles of generating the plasma and have their own advantages and disadvantages. Accordingly, the ICP type and the CCP type are selectively used as occasion demands.

FIG. 1 is an inductively coupled plasma type substrate processing apparatus according to the related art. In FIG. 1, a substrate processing apparatus 10 includes a chamber 12, an antenna 14, a gas supplying plate 16 and a substrate supporter 18. The chamber 12 includes a lid 12a and a body 12b and provides a reaction space isolated from an exterior for processing a substrate. The lid 12a may be formed of an insulating material capable of transmitting an induced electric field of the antenna 14 to an interior of the chamber 12.

The antenna 14 is disposed over and spaced apart from the lid 12a. The antenna 14 is connected to a radio frequency (RF) power supply 22 through a feeder line 20, and the RF power supply 22 supplies an RF power to the antenna 14. The antenna 14 includes first and second antennas 14a and 14b. In addition, the feeder line 20 includes first and second feeder lines 20a and 20b. The first antenna 14a is connected to the RF power supply 22 through the first feeder line 20a and a variable capacitor C, and the second antenna 14b is connected to the RF power supply 22 through the second feeder line 20b. Accordingly, the first and second antennas 14a and 14b are connected to the RF power supply 22 in parallel. Further, a matcher 24 for matching a load and a source impedance is formed between the antenna 14 and the RF power supply 22.

The gas supplying plate 16 is connected to a gas supplying pipe 26 and sprays a process gas through the gas supplying pipe 26 into the interior of the chamber 12. The substrate supporter 18 faces into the gas supplying plate 16 and a substrate 28 is disposed on the substrate supporter 18.

In addition, the substrate processing apparatus 10 further includes a gate (not shown) for transferring the substrate 28 into and/or from the chamber 12 and an exhaust 30 for outputting a reaction gas and a residual product from the chamber 12.

In the substrate processing apparatus 10, when the RF power is applied to the antenna 14, a time varying magnetic field of a horizontal direction is generated around the antenna 14 and an electric field of a vertical direction is induced by the time varying magnetic field. The induced electric field is transmitted into the chamber 12 and electrons in the chamber 12 are accelerated by the induced electric field. The accelerated electrons collide with a neutral gas to generate ions and radicals, i.e., a plasma, and the depositing and etching processes are performed using the plasma.

While the first antenna 14a is connected to the first feeder line 20a and the RF power supply 22 through a first incoming portion 40a disposed at a center of the lid 12a, the second antenna 14b is connected to the second feeder line 20b and the RF power supply 22 through a second incoming portion 40b disposed at a region separated from the center of the lid 12a. Since the second incoming portion 40b of the second antenna 14b deviates from and is spaced apart from the center of the lid 12a, the first and second antennas 14a and 14b are not symmetrically disposed with respect to the center of the lid 12a. As a result, the RF power supplied from the RF power supply 22 is not uniformly distributed to the first and second antennas 14a and 14b and the uniformity of plasma density in the chamber 12 is deteriorated.

SUMMARY

Accordingly, the present disclosure is directed to an antenna unit for generating a plasma and a substrate processing apparatus including the antenna unit that substantially obviates one or more of the problems due to limitations and disadvantages of the related art.

An object of the present disclosure is to provide an antenna unit including a coaxial incoming portion and a substrate processing apparatus including the antenna unit where uniformity of plasma density is improved.

Another object of the present disclosure is to provide an antenna unit including a coaxial incoming portion at a center of a lid and a plurality of antennas connected to a radio frequency power supply in parallel through the coaxial incoming portion and a substrate processing apparatus including the antenna unit where a radio frequency power is uniformly distributed to the plurality of antennas.

To achieve these and other advantages and in accordance with the purpose of the present invention, as embodied and broadly described, an antenna unit for generating a plasma includes: a first antenna including a first incoming portion and a plurality of first sub-antennas divided from the first incoming portion; and a second antenna including a second incoming portion and a plurality of second sub-antennas divided from the second incoming portion, the first and second incoming portions constituting a coaxial line.

In another aspect, a substrate processing apparatus includes: a chamber including a lid and a body; an antenna unit over the lid, wherein the antenna unit comprises: a first antenna including a first incoming portion and a plurality of first sub-antennas divided from the first incoming portion; and a second antenna including a second incoming portion and a plurality of second sub-antennas divided from the second incoming portion, the first and second incoming portions constituting a coaxial line; and a radio frequency power supply applying a radio frequency power to the antenna unit.

It is to be understood that both the foregoing general description and the following detailed description are exemplary and explanatory and are intended to provide further explanation of the invention as claimed

BRIEF DESCRIPTION OF THE DRAWINGS

The accompanying drawings, which are included to provide a further understanding of the invention and are incorporated in and constitute a part of this specification, illustrate embodiments of the invention.

In the drawings.

DETAILED DESCRIPTION OF THE PREFERRED EMBODIMENTS

Reference will now be made in detail to embodiments which are illustrated in the accompanying drawings. Wherever possible, similar reference numbers will be used to refer to the same or similar parts.

Figure 1:
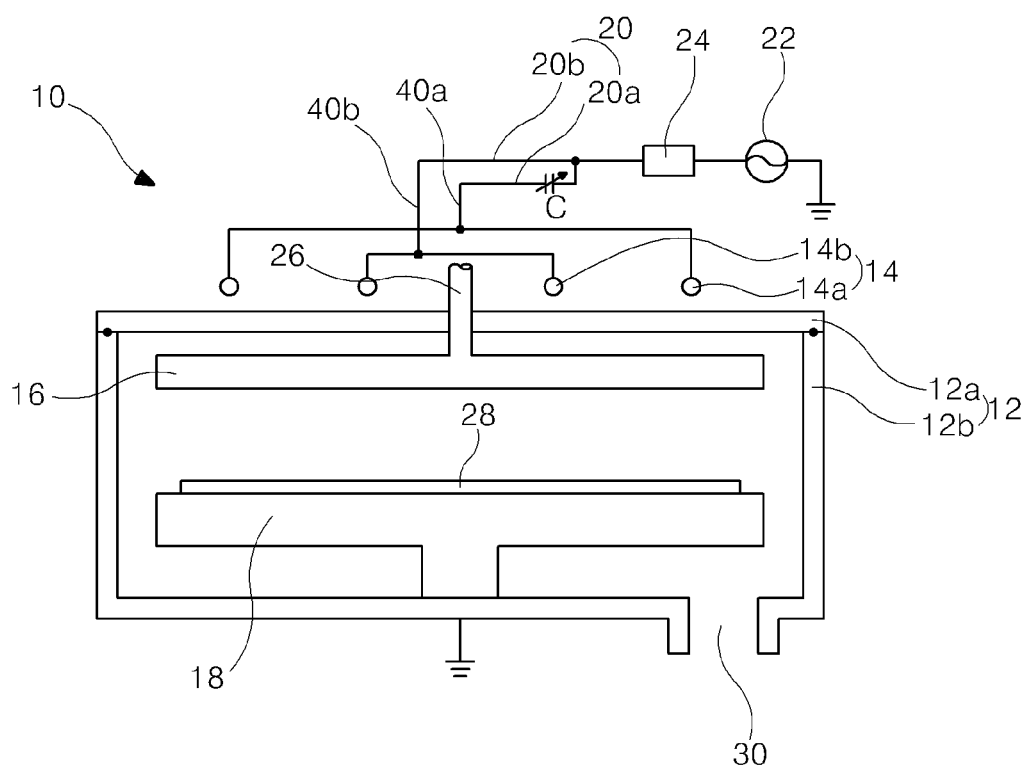
FIG. 1 is an inductively coupled plasma type substrate processing apparatus according to the related art.
Figure 2:
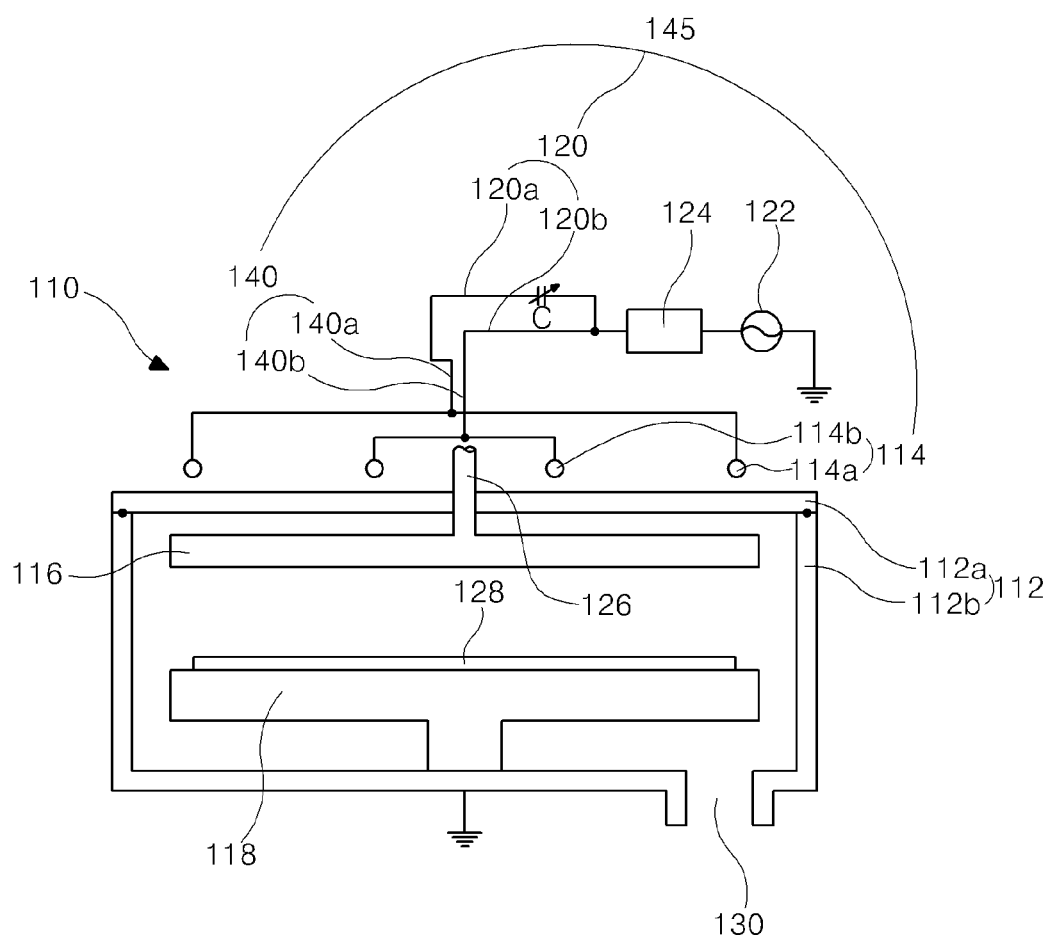
FIG. 2 is a cross-sectional view showing an inductively coupled type substrate processing apparatus according to an embodiment of the present invention.

FIG. 2 is a cross-sectional view showing an inductively coupled type substrate processing apparatus according to an embodiment of the present invention.

In FIG. 2, a substrate processing apparatus 110 includes a chamber 112, an antenna unit 145, a gas supplying plate 116 and a substrate supporter 118. The chamber 112 including a lid 112a and a body 112b provides as reaction space isolated from an exterior for processing a substrate 128. The lid 112a may be formed of an insulating material so that an induced electric field of the antenna 114 can be transmitted to an interior of the chamber 112 and a plasma can be generated in the chamber 112. The lid 112a of an insulating material may reduce a capacitive coupling between the antenna 114 and the plasma.

The antenna unit 145 is disposed over and spaced apart from the lid 112a. The antenna unit 145 includes an antenna 114 and a feeder line 120, and antenna 114 includes an incoming portion 140 directly connected to the feeder line 120. The antenna 114 is connected to a radio frequency (RF) power supply 122 through the feeder line 120, and the RF power supply 122 supplies an RF power to the antenna 114. The antenna 114 may include first and second antennas 114a and 114b, and the incoming portion 140 may include first and second incoming portions 140a and 140b. In addition, the feeder line 120 may include first and second feeder lines 120a and 120b. The first and second incoming portions 140a and 140b may be formed as a coaxial line so that both the first and second incoming portions 140a and 140b can be disposed at a center of the lid 112a.

The first incoming portion 140a of the first antenna 114a is connected to the RF power supply 122 through the first feeder line 120a and a variable capacitor C, and the second incoming portion 140b of the second antenna 114b is connected to the RF power supply 122 through the second feeder line 120b. Accordingly, the first and second antennas 114a and 114b are connected to the RF power supply 122 in parallel. Further, a matcher 124 for matching a load and a source impedance is formed between the antenna 114 and the RF power supply 122.

The gas supplying plate 116 is connected to a gas supplying pipe 126 and sprays a process gas through the gas supplying pipe 126 into the interior of the chamber 112. The substrate supporter 118 faces into the gas supplying plate 116 and the substrate 128 is disposed on the substrate supporter 118. In addition, the substrate processing apparatus 110 further includes a gate (not shown) for transferring the substrate 128 into and/or from the chamber 112 and an exhaust 130 for outputting a reaction gas and a residual product from the chamber 112.

Figure 3:
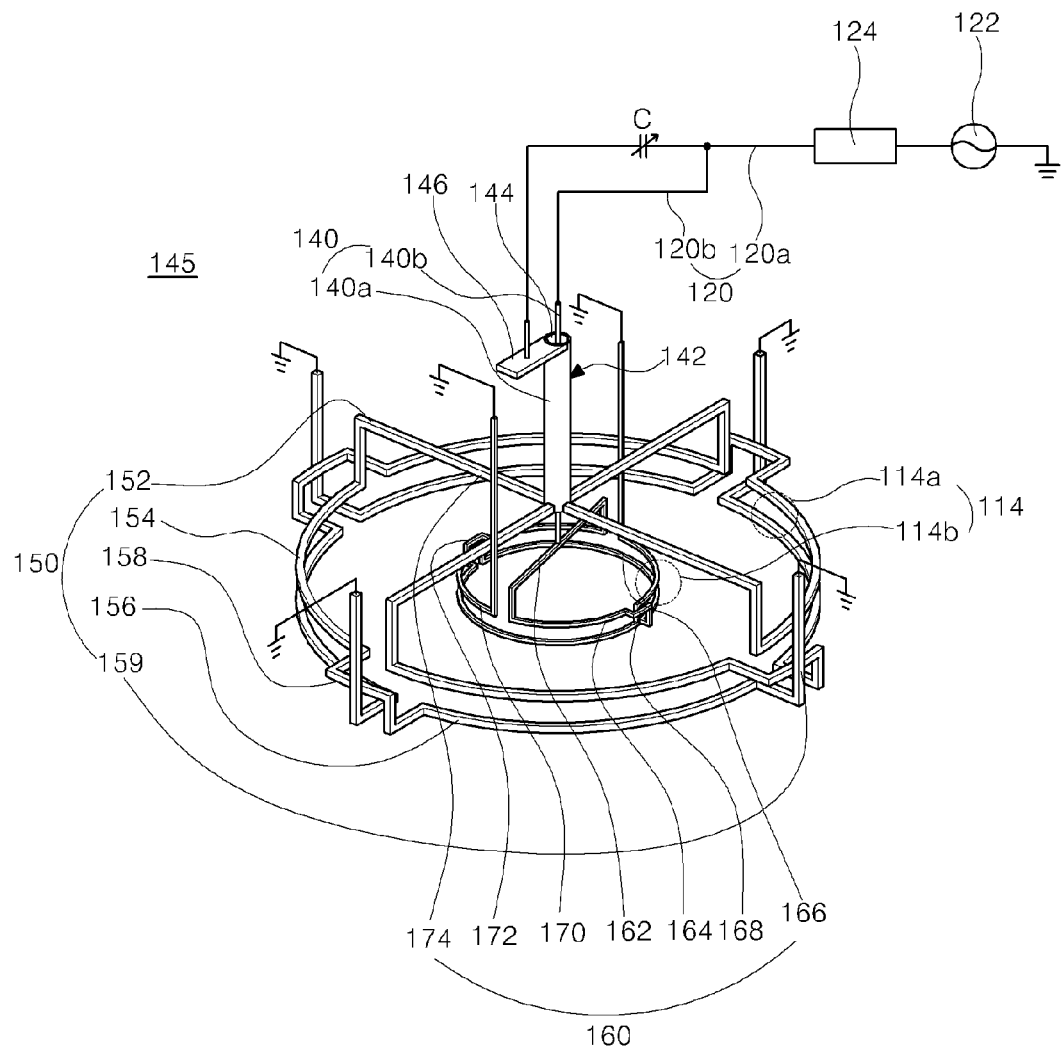
FIG. 3 is a perspective view showing an antenna unit for a substrate processing apparatus according to an embodiment of the present invention.

FIG. 3 is a perspective view showing an antenna unit for a substrate processing apparatus according to an embodiment of the present invention.

In FIG. 3, the antenna unit 145 includes the antenna 114 and the feeder line 120, and the antenna 114 includes the incoming portion 140 directing contacting the feeder line 120. The antenna 114 is connected to the feeder line 120 through the incoming portion 140. The antenna 114 includes the first and second antennas 114a and 114b. The lid 112a (of FIG. 2) includes an outer concentric region and an inner concentric region with respect to a center of the lid 112a. The first antenna 114a may be disposed in the outer concentric region of the lid 112a and the second antenna 114b may be disposed in the inner concentric region of the lid 112a. The incoming portion 140 includes the first and second incoming portions 140a and 140b, and the first and second antennas 114a and 114b include the first and second incoming portions 140a and 140b, respectively. In addition, the feeder line 120 includes the first and second feeder lines 120a and 120b.

The first and second antennas 114a and 114b are connected to the RF power supply 122 in parallel. The second feeder line 120b is divided from a division point of the first feeder line 120a connecting the first antenna 114a and the matcher 124, and the second antenna 114b is connected to the second feeder line 120b. A variable capacitor C is connected between the division point and the first incoming portion 140a, and a ratio of currents flowing through the first and second antennas 114a and 114b may be adjusted by the variable capacitor C. Although not shown, an additional variable capacitor may be connected between the division point and the second incoming portion 140b to adjust the ratio of currents flowing through the first and second antennas 114a and 114b more easily.

The first and second incoming portions 140a and 140b of the first and second antennas 114a and 114b may be formed as a coaxial line 142 at a center of the lid 112a. For example, the first incoming portion 140a may include a hollow therein and the second incoming portion 140b may be disposed in the hollow of the first incoming portion 140a. In addition, a space between the first and second incoming portions 140a and 140b may be filled with an insulator 144. The insulator 144 may include a resin such as Teflon. The first incoming portion 140a of the first antenna 114a is connected to the first feeder line 120a, and the second incoming portion 140b of the second antenna 114b is connected to the second feeder line 120b.

The first and second incoming portions 140a and 140b of the coaxial line 142 may be spaced apart from each other by about 30 mm. The insulator 144 may contact the first and second incoming portions 140a and 140b. Alternatively, the insulator 144 may be spaced apart from at least one of the first and second incoming portions 140a and 140b by about 1 mm.

A protrusion 146 may be formed at an upper end of the first incoming portion 140a for connection with the first feeder line 120a. The second incoming portion 140b of the second antenna 114b may upwardly protrude from the coaxial line 142 to be connected to the second feeder line 120b. However, since the first and second incoming portions 140a and 140b are formed as the coaxial line 142, it is difficult to connect the first feeder line 120a and the first incoming portion 140a of the first antenna 114a directly. Accordingly, the first feeder line 120a may be easily connected to the first incoming portion 140a by connecting the first feeder line 120a and the protrusion 146 outwardly protruding from the upper end of the first incoming portion 140a.

The first antenna 114a may include a plurality of first sub-antennas 150 divided from a lower end of the first incoming portion 140a. Each of the plurality of first sub-antennas 150 may have a half arc shape such that the plurality of first sub-antennas 150 constitute a ring shape. For example, at least one of the plurality of first sub-antennas 150 may include a first branch portion 152, a first former arc portion 154, a first bent portion 158, a first latter arc portion 156 and a first ground portion 159. The first branch portion 152 is divided from the lower end of the first incoming portion 140a, and the first former arc portion 154 is connected to the first branch portion 152. In addition, the first bent portion 158 is connected between the first former arc portion 154 and the first latter arc portion 156, and the first latter arc portion 156 is connected to the first former arc portion 154 through the first bent portion 158.

The first branch portion 152 may be connected to the lower end of the first incoming portion 140a of a cylindrical shape by a bolt. For example, four first branch portions 152 may be connected to the lower end of the first incoming portion 140a and an angle between the two adjacent first branch portions 152 may be about 90°.

The first bent portion 158 may be vertically and horizontally bent between the first former arc portion 154 and the first latter arc portion 156 so that the first former arc portion 154 and the first latter arc portion 156 can be connected through the first bent portion 158 without contact of the adjacent first sub-antennas 150. For example, the first former arc portion 154 of one first sub-antenna 150 may be disposed over the first latter arc portion 156 of the left adjacent first sub-antenna 150, and the first latter arc portion 156 of one first sub-antenna 150 may be disposed under the first former arc portion 154 of the right adjacent first sub-antenna 150. The first ground portion 159 may be disposed normal to the lid 112a and may be connected to an external ground to be grounded.

The second antenna 114b may include a plurality of second sub-antennas 160 divided from a lower end of the second incoming portion 140b. Each of the plurality of second sub-antennas 160 may have a ring shape. For example, each of the plurality of second sub-antennas 160 may include a second branch portion 162, a second former arc portion 164, a second bent portion 168, a second middle arc portion 166, a third bent portion 172, a second latter arc portion 170 and a second ground portion 174. The second branch portion 162 is divided from the lower end of the second incoming portion 140b, and the second former arc portion 164 is connected to the second branch portion 162. In addition, the second bent portion 168 is connected between the second former arc portion 164 and the second middle arc portion 166, and the third bent portion 172 is connected between the second middle arc portion 166 and the second latter arc portion 170. Further, the second middle arc portion 166 is connected to the second former arc portion 164 through the second bent portion 168, and the second latter arc portion 170 is connected to the second middle arc portion 166 through the third bent portion 172.

The second branch portion 162 may be connected to the lower end of the second incoming portion 140b. For example, two second branch portions 162 may be connected to the lower end of the second incoming portion 140b and an angle between the two first branch portions 162 may be about 180°.

The second bent portion 168 may be vertically and horizontally bent between the second former arc portion 164 and the second middle arc portion 168, and the third bent portion 172 may be vertically and horizontally bent between the second middle arc portion 168 and the second latter arc portion 170. Accordingly, the second former arc portion 164 and the second middle arc portion 168 can be connected through the second bent portion 168 and the second middle arc portion 168 and the second latter arc portion 170 can be connected through the third bent portion 172 without contact of the adjacent second sub-antennas 160. For example, the second former arc portion 164 and the second latter arc portion 170 of one second sub-antenna 160 may be disposed over the second middle arc portion 168 of the other second sub-antenna 160, and the second middle arc portion 168 of one second sub-antenna 160 may be disposed under the second former arc portion 164 and the second latter arc portion 170 of the other second sub-antenna 160. The second ground portion 174 may be disposed normal to the lid 112a and may be connected to an external ground to be grounded.

Since the first former arc portion 154 of one first sub-antenna 150 is disposed over the first latter arc portion 156 of the other first sub-antenna 150, an RF magnetic field generated by the first former arc portion 154 is partially shielded by the first latter arc portion 156. In addition, since the first latter arc portion 156 is farther from the RF power supply 122 than the first former arc portion 154, the RF magnetic field by the first latter arc portion 156 may have a smaller intensity than the RF magnetic field by the first former arc portion 154. As a result, local non-uniformity of plasma density due to a strong RF magnetic field adjacent to the RF power supply 122 is prevented. Similarly, since the second former arc portion 164 and the second latter arc portion 172 of one second sub-antenna 160 are disposed over the second middle arc portion 168 of the adjacent second sub-antenna 160, the local non-uniformity of plasma density due to a strong RF magnetic field adjacent to the RF power supply 122 is prevented.

Although the first antenna 114a includes four first sub-antennas 150 divided from the first incoming portion 140a with an angle of about 90° and the second antenna 114b includes two second sub-antennas 160 divided from the second incoming portion 140b with an angle of about 180° in FIG. 3, the number of the plurality of first sub-antennas 150 and the number of the plurality of second sub-antennas 160 may vary as occasion demands in another embodiment.

Figure 4A:
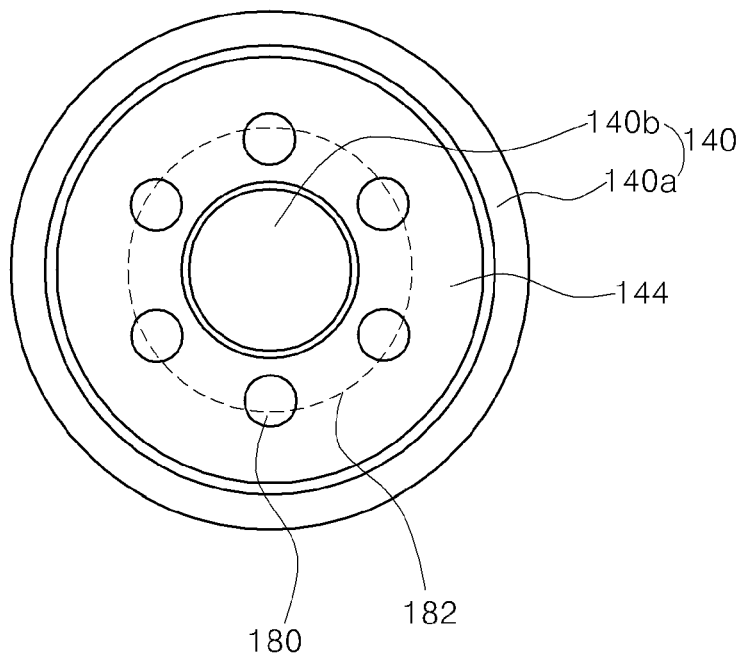
FIG. 4A is a cross-sectional view showing a coaxial incoming portion of an antenna unit according to an embodiment of the present invention.
Figure 4B:
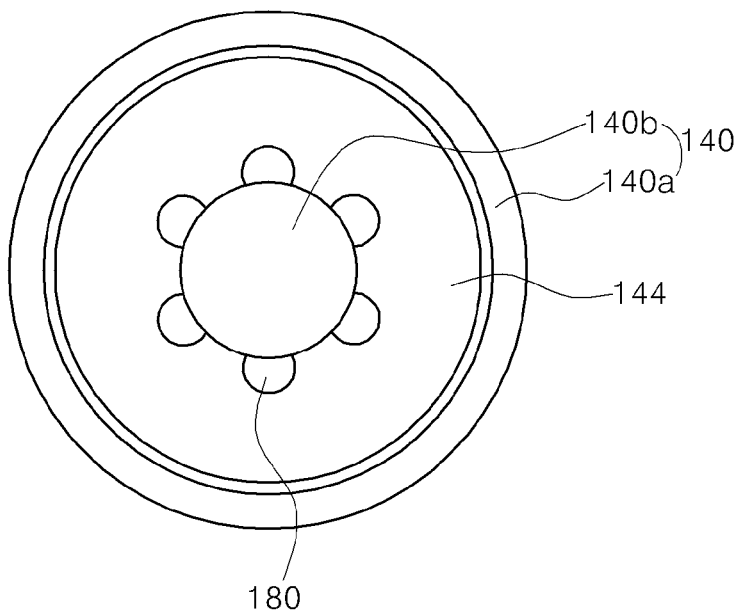
FIG. 4B is a cross-sectional view showing a coaxial incoming portion of an antenna unit according to another embodiment of the present invention.

FIG. 4A is a cross-sectional view showing a coaxial incoming portion of an antenna unit according to an embodiment of the present invention, and FIG. 4B is a cross-sectional view showing a coaxial incoming portion of an antenna unit according to another embodiment of the present invention.

In FIG. 4A, the first incoming portion 140a of the first antenna 114a and the second incoming portion 140b of the second antenna 114b are formed as the coaxial line 142 at the center of the lid 112a (of FIG. 2). The second incoming portion 140b connected to the second feeder line 120b (of FIG. 3) is disposed at a center of the coaxial line 142, and the first incoming portion 140a connected to the first feeder line 120a (of FIG. 3) surrounds the second incoming portion 140b. In addition, the space between the first and second incoming portions 140a and 140b is filled with the insulator 144. The insulator 144 may include a resin such as Teflon.

The first and second incoming portions 140a and 140b may be spaced apart from each other by a distance of about 30 mm. Further, the insulator 144 may be spaced apart from each of the first and second incoming portions 140a and 140b by a distance of about 1 mm. Since the first incoming portion 140a is exposed to the exterior, it is relatively easy to radiate a heat of the first incoming portion 140a. However, since the second incoming portion 140b is surrounded by the insulator 144 and the first incoming portion 140a, it is relatively hard to radiate a heat of the second incoming portion 140b. To cool down the second incoming portion 140b, a plurality of flow paths 180 for a refrigerant are formed in the insulator 144. For example, the plurality of flow paths 180 may be formed to penetrate the insulator 144. In addition, the plurality of flow paths 180 are formed to be adjacent to the second incoming portion 140b to cool down the second incoming portion 140b effectively. For example, a center of at least one of the plurality of flow paths 180 may be disposed between a circle 182 corresponding to a central line of the insulator 144 and the second incoming portion 140b.

In FIG. 4B, the first incoming portion 140a of the first antenna 114a and the second incoming portion 140b of the second antenna 114b are formed as the coaxial line 142 at the center of the lid 112a (of FIG. 2). The second incoming portion 140b connected to the second feeder line 120b (of FIG. 3) is disposed at a center of the coaxial line 142, and the first incoming portion 140a connected to the first feeder line 120a (of FIG. 3) surrounds the second incoming portion 140b. In addition, the space between the first and second incoming portions 140a and 140b is filled with the insulator 144. The insulator 144 may include a resin such as Teflon.

The first and second incoming portions 140a and 140b may be spaced apart from each other by a distance of about 30 mm. Further, the insulator 144 may contact the second incoming portion 140b and may be spaced apart from the first incoming portions 140a by a distance of about 1 mm. The insulator 144 may contact the first incoming portion 140a in another embodiment. Since the first incoming portion 140a is exposed to the exterior, it is relatively easy to radiate a heat of the first incoming portion 140a. However, since the second incoming portion 140b is surrounded by the insulator 144 and the first incoming portion 140a, it is relatively hard to radiate a heat of the second incoming portion 140b. To cool down the second incoming portion 140b, a plurality of flow paths 180 for a refrigerant are formed in the insulator 144. For example, the plurality of flow paths 180 may be formed to penetrate the insulator 144. In addition, the plurality of flow paths 180 are formed to contact the second incoming portion 140b to cool down the second incoming portion 140b further effectively. For example, a surface of the second incoming portion 140b may constitute a portion of at least one of the plurality of flow paths 180. Since the refrigerant directly contact the second incoming portion 140b, a cooling efficiency is improved.

Consequently, in a ICP type substrate processing apparatus including an antenna unit according to the present invention, a plurality of antennas are connected to an RF power supply in parallel and a plurality of incoming portions of the plurality of antennas are formed as a coaxial line at a center of a lid. As a result, an RF power is uniformly applied to the plurality of antennas and uniformity of plasma density is improved.

It will be apparent to those skilled in the art that various modifications and variations can be made in an antenna unit for generating a plasma and a substrate processing apparatus including the antenna unit of the present invention without departing from the spirit or scope of the invention. Thus, it is intended that the present invention cover the modifications and variations of this invention provided they come within the scope of the appended claims and their equivalents.

What is claimed is:

1. An antenna unit for generating a plasma, comprising:
   a first antenna including a first incoming portion and a plurality of first sub-antennas divided from the first incoming portion; and
   a second antenna including a second incoming portion and a plurality of second sub-antennas divided from the second incoming portion, the first and second incoming portions constituting a coaxial line,
   wherein the first incoming portion includes a hollow and the second incoming portion is disposed in the hollow, and wherein a space between the first and second incoming portions is filled with an insulator,
   wherein a plurality of flow paths for a refrigerant are formed in the insulator, and
   wherein the insulator contacts the second incoming portion and a surface of the second incoming portion constitute a portion of at least one of the plurality of flow paths.

2. The antenna unit according to claim 1, wherein at least one of the plurality of first sub-antennas comprises:
   a first branch portion divided from a lower end of the first incoming portion;
   a first former arc portion connected to the first branch portion;
   a first latter arc portion connected to the first former arc portion; and
   a first bent portion connected between the first former arc portion and the first latter arc portion.

3. The antenna unit according to claim 2, wherein the first former arc portion of one of the plurality of first sub-antennas is disposed over the first latter arc portion of an adjacent one of the plurality of first sub-antennas.

4. The antenna unit according to claim 3, wherein at least one of the plurality of second sub-antennas comprises:
   a second branch portion divided from a lower end of the second incoming portion;
   a second former arc portion connected to the second branch portion;
   a second middle arc portion connected to the second former arc portion;
   a second latter arc portion connected to the second middle arc portion;
   a second bent portion connected between the second former arc portion and the second middle arc portion; and
   a third bent portion connected between the second middle arc portion and the second latter arc portion.

5. The antenna unit according to claim 4, wherein the second former arc portion and the second latter arc portion of one of the plurality of second sub-antennas are disposed over the second middle arc portion of the other of the plurality of second sub-antennas.

6. The antenna unit according to claim 5, wherein the at least one of the plurality of first sub-antennas further includes a first ground portion connected to the first latter arc portion, and the at least one of the plurality of second sub-antennas further includes a second ground portion connected to the second latter arc portion.

7. The antenna unit according to claim 1, wherein the first and second antennas are connected to a radio frequency power supply in parallel.

8. An antenna unit for generating a plasma, comprising:
a first antenna including a first incoming portion and a plurality of first sub-antennas divided from the first incoming portion; and
a second antenna including a second incoming portion and a plurality of second sub-antennas divided from the second incoming portion, the first and second incoming portions constituting a coaxial line,
wherein the first incoming portion includes a hollow and the second incoming portion is disposed in the hollow,
wherein a space between the first and second incoming portions is filled with an insulator,
wherein a plurality of flow paths for a refrigerant are formed in the insulator, and
wherein the insulator is spaced apart from the second incoming portion and at least one of the plurality of flow paths is disposed adjacent to the second incoming portion.

9. A substrate processing apparatus, comprising:
a chamber including a lid and a body;
an antenna unit over the lid, wherein the antenna unit comprises:
a first antenna including a first incoming portion and a plurality of first sub-antennas divided from the first incoming portion; and
a second antenna including a second incoming portion and a plurality of second sub-antennas divided from the second incoming portion, the first and second incoming portions constituting a coaxial line; and
a radio frequency power supply applying a radio frequency power to the antenna unit,
wherein the first incoming portion includes a hollow and the second incoming portion is disposed in the hollow, and wherein a space between the first and second incoming portions is filled with an insulator,
wherein a plurality of flow paths for a refrigerant are formed in the insulator, and
wherein the insulator contacts the second incoming portion and a surface of the second incoming portion constitute a portion of at least one of the plurality of flow paths.

10. The substrate processing apparatus according to claim 9, wherein the first incoming portion is connected to the radio frequency power supply through a first feeder line and a variable capacitor, and the second incoming portion is connected to the radio frequency power supply through a second feeder line, and wherein the first and second antennas are connected to the radio frequency power supply in parallel.

11. A substrate processing apparatus, comprising:
a chamber including a lid and a body;
an antenna unit over the lid, wherein the antenna unit comprises:
a first antenna including a first incoming portion and a plurality of first sub-antennas divided from the first incoming portion; and
a second antenna including a second incoming portion and a plurality of second sub-antennas divided from the second incoming portion, the first and second incoming portions constituting a coaxial line; and
a radio frequency power supply applying a radio frequency power to the antenna unit,
wherein the first incoming portion includes a hollow and the second incoming portion is disposed in the hollow, and wherein a space between the first and second incoming portions is filled with an insulator,
wherein a plurality of flow paths for a refrigerant are formed in the insulator, and
wherein the insulator is spaced apart from the second incoming portion and at least one of the plurality of flow paths is disposed adjacent to the second incoming portion.

* * * * *